US009071899B2

(12) United States Patent
Ivey et al.

(10) Patent No.: US 9,071,899 B2
(45) Date of Patent: Jun. 30, 2015

(54) NARROW CEILING PANEL SPEAKER SYSTEMS

(71) Applicant: Mitek Corp., Inc., Phoenix, AZ (US)

(72) Inventors: Johnathan Loyd Ivey, Chandler, AZ (US); Kevin Sykes, Phoenix, AZ (US)

(73) Assignee: Mitek Corp., Inc., Phoenix, AZ (US)

( * ) Notice: Subject to any disclaimer, the term of this patent is extended or adjusted under 35 U.S.C. 154(b) by 0 days.

(21) Appl. No.: 14/324,566

(22) Filed: Jul. 7, 2014

(65) Prior Publication Data

US 2015/0008067 A1 Jan. 8, 2015

Related U.S. Application Data

(60) Provisional application No. 61/843,507, filed on Jul. 8, 2013.

(51) Int. Cl.

| | |
|---|---|
| ***H05K 5/03*** | (2006.01) |
| ***H05K 5/02*** | (2006.01) |
| ***H04R 1/02*** | (2006.01) |
| *H05K 5/00* | (2006.01) |
| *H04R 1/00* | (2006.01) |

(52) U.S. Cl.

CPC .......... *H04R 1/025* (2013.01); *H04R 2201/021* (2013.01)

(58) Field of Classification Search

USPC .......... 181/150, 148, 160, 199; 381/345, 350, 381/389, 391, 395, 386, 86, 302, 87

See application file for complete search history.

(56) References Cited

U.S. PATENT DOCUMENTS

| | | | | |
|---|---|---|---|---|
| 2,830,330 | A * | 4/1958 | Heath | 52/28 |
| 4,330,691 | A * | 5/1982 | Gordon | 381/335 |
| 4,385,210 | A * | 5/1983 | Marquiss | 381/431 |
| 4,439,643 | A * | 3/1984 | Schweizer | 381/395 |
| 4,484,658 | A * | 11/1984 | Grote | 381/395 |
| 4,720,867 | A * | 1/1988 | Imai et al. | 381/86 |
| 4,891,842 | A * | 1/1990 | Green | 381/392 |
| 4,923,032 | A * | 5/1990 | Nuernberger | 181/150 |
| 5,088,574 | A * | 2/1992 | Kertesz, III | 181/150 |
| 5,138,656 | A * | 8/1992 | Shanes | 379/167.11 |
| 5,828,765 | A * | 10/1998 | Gable | 381/386 |
| 6,386,315 | B1 * | 5/2002 | Roy et al. | 181/150 |

(Continued)

OTHER PUBLICATIONS

Armstrong (R) TechZone (TM) Ceiling Systems, 2012. Entire document: no speaker panels.

*Primary Examiner* — Edgardo San Martin
(74) *Attorney, Agent, or Firm* — Keith L. Jenkins, Registered Patent Attorney, LLC; Keith L. Jenkins

(57) ABSTRACT

Narrow ceiling speaker panels designed to be compatible with Armstrong® TECHZONE™ suspended ceiling systems that include an end-flanged grill box nested in a baffle that supports a loudspeaker and associated electronics and which is nested in a flanged grill that is sized for compatibility. Attachments are though the grill box end flanges and baffle panel and through grill edge flanges and baffle edge flanges. The loudspeaker and associated electronics are fastened to the top side of the baffle through pre-drilled or punched holes. The grill may have a decorative appearance by virtue of edge style, pattern of holes, color, or finish.

20 Claims, 8 Drawing Sheets

(56) References Cited

U.S. PATENT DOCUMENTS

| | | | | |
|---|---|---|---|---|
| 6,944,312 | B2 * | 9/2005 | Mason et al. | 381/391 |
| 6,950,526 | B2 * | 9/2005 | Garstick | 381/73.1 |
| 7,120,269 | B2 * | 10/2006 | Lowell et al. | 381/386 |
| 7,324,656 | B2 * | 1/2008 | Iwayama et al. | 381/386 |
| 7,643,647 | B2 * | 1/2010 | Lowell et al. | 381/386 |
| 7,861,825 | B2 * | 1/2011 | Stewart et al. | 181/252 |
| 8,276,706 | B2 * | 10/2012 | Hudson et al. | 181/148 |
| 8,300,869 | B2 * | 10/2012 | Marlin et al. | 381/340 |

* cited by examiner

NARROW CEILING PANEL SPEAKER SYSTEMS

RELATED APPLICATIONS

This application claims the benefit of U.S. provisional patent application Ser. No. 61/843,507 filed Jul. 8, 2013 to the same inventor, the contents of which are incorporated herein by reference.

TECHNICAL FIELD

This invention relates to providing ceiling panels that support audio speakers and that fit in narrow spaces in patterns having both narrow and larger or standard sized ceiling panels.

BACKGROUND

Ceiling panel speakers are used in suspended ceiling systems to provide audio for alarms, paging, music, and public announcements. Some ceiling panel systems use combinations of standard or large panels with narrow panels. For example, Armstrong® Techzone™ ceiling systems use combinations of narrow and large ceiling panels, but do not offer narrow panels that are speaker panels. Accordingly, there is an unmet need in the marketplace.

Therefore, a need exists for a narrow ceiling speaker panel that is compatible with legacy ceiling systems that use combinations of narrow and larger ceiling panels.

OBJECTS AND FEATURES OF THE INVENTION

A primary object and feature of the present invention is to overcome the above-mentioned problems and fulfill the above-mentioned needs.

Another object and feature of the present invention is to provide a system of narrow ceiling speaker panels that are compatible with legacy systems.

It is a further object and feature of the present invention to provide a system that includes ceiling speaker panels that are lightweight and strong.

It is a further object and feature of the present invention to provide a system that includes ceiling speaker panels that can receive finishes compatible with legacy systems.

It is a further object and feature of the present invention to provide a system that includes ceiling speaker panels having a full range of edge style options, in keeping with legacy systems.

It is a further object and feature of the present invention to provide a system that includes ceiling speaker panels in a variety of sizes compatible with legacy systems.

It is an additional primary object and feature of the present invention to provide such a system that is efficient, inexpensive and handy. Other objects and features of this invention will become apparent with reference to the following descriptions.

SUMMARY OF THE INVENTION

A system including various narrow ceiling speaker panels for suspended ceiling systems using a variety of narrow and larger panels. Each panel includes a baffle supporting a speaker and associated electronics, such as a transformer. Support may be by fasteners, such as screws, through pre-drilled holes in the baffle. The baffle has an opening through which the sound from the supported speaker is directed. The baffle attaches on the top side to end flanges of a grill box and has a perimeter flange that envelops a bottom portion of the grill box. Attachment may be by fasteners, such as screws, through pre-drilled holes in the baffle and end flanges. The grill box has openings for power and signal lines to the speaker and associated electronics. A speaker grill has edge flanges that envelop and attach to the bottom side edge flanges of the baffle. Attachment may be by fasteners through pre-drilled holes in edge flanges of the speaker grill aligned with pre-drilled holes in edge flanges of the baffle.

In a particular embodiment, A ceiling panel loudspeaker including: a grill box having first and second end flanges extending from first and second bottom edges of respective first and second sides; a baffle having a perimeter flange sized to envelop a bottom portion of the grill box and having a speaker opening for aligning to an output portion of a loudspeaker; and a foraminous speaker grill: having a grill perimeter flange sized to envelop the baffle; and sized to fit within a narrow slot between suspended ceiling supports. The ceiling panel loudspeaker, further including the loudspeaker attached to a top side of the baffle and aligned to the speaker opening. The ceiling panel loudspeaker, further including electronics associated with the loudspeaker attached to the top side of the baffle and coupled to the loudspeaker. The ceiling panel loudspeaker, where the baffle is attached to the grill box using fasteners through the first and second end flanges. The ceiling panel loudspeaker, where the grill is attached to the baffle using fasteners through the grill perimeter flange and through the baffle perimeter flange. The ceiling panel loudspeaker, where the grill box further includes at least two openings for conducting power and signal cables to the electronics and the loudspeaker. The ceiling panel loudspeaker, where the grill box is formed from a single cut sheet of metal. The ceiling panel loudspeaker, where the grill has a width for fitting the narrow slot and the width of the narrow slot includes either six inches or four inches. The ceiling panel loudspeaker, where the grill has a length including either six inches, twelve inches, forty-two inches, forty-eight inches, fifty-four inches, sixty inches, or ninety-six inches. The ceiling panel loudspeaker, where the grill has a decorative appearance.

A ceiling panel loudspeaker including: a grill box having: first and second end flanges extending from first and second bottom edges of respective first and second sides; and first and second cable openings; a baffle including a panel having: a perimeter flange sized to envelop a bottom portion of the grill box; a loudspeaker opening for aligning to an output portion of a loudspeaker; and a plurality of fastener openings proximate each loudspeaker opening; and a foraminous speaker grill: having a grill perimeter flange sized to envelop the baffle; and sized to fit within a narrow slot between suspended ceiling supports. The ceiling panel loudspeaker, further including: the loudspeaker attached to a top side of the baffle and aligned to the loudspeaker opening; electronics associated with the loudspeaker attached to the top side of the baffle and coupled to the loudspeaker. The ceiling panel loudspeaker, where: the baffle is attached to the grill box using fasteners through the first and second end flanges; and the grill is attached to the baffle using fasteners through the grill perimeter flange and through the baffle perimeter flange. The ceiling panel loudspeaker, where the grill box is formed from a single cut sheet of metal. The ceiling panel loudspeaker, where the grill has: a width for fitting the narrow slot and the width of the narrow slot includes either six inches or four inches; and a length including either six inches, twelve inches, forty-two inches, forty-eight inches, fifty-four inches, sixty inches, or ninety-six inches. The ceiling panel loudspeaker, where the grill has a decorative appearance.

A ceiling panel loudspeaker including: a grill box made of a single piece of cut sheet metal having: first and second end flanges extending from first and second bottom edges of respective first and second sides; and first and second cable openings; a baffle including a panel having: a perimeter flange sized to envelop a bottom portion of the grill box; a loudspeaker opening for aligning to an output portion of a loudspeaker; and a plurality of fastener openings proximate each loudspeaker opening; and a foraminous speaker grill: having a grill perimeter flange sized to envelop the baffle; and sized to fit within a narrow slot between suspended ceiling supports; and a plurality of fasteners for fastening the baffle to the grill box and for fastening the grill to the baffle. The ceiling panel loudspeaker, further including: the loudspeaker attached to a top side of the baffle and aligned to the loudspeaker opening; electronics associated with the loudspeaker attached to the top side of the baffle and coupled to the loudspeaker. The ceiling panel loudspeaker, where: the baffle is attached to the grill box using fasteners through the first and second end flanges; and the grill is attached to the baffle using fasteners through the grill perimeter flange and through the baffle perimeter flange. The ceiling panel loudspeaker, where the grill has: a width for fitting the narrow slot and the width of the narrow slot includes either six inches or four inches; and a length including either six inches, twelve inches, forty-two inches, forty-eight inches, fifty-four inches, sixty inches, or ninety-six inches.

BRIEF DESCRIPTION OF THE DRAWINGS

The present invention will hereinafter be described in conjunction with the following drawing figures, wherein like numerals denote like elements.

DETAILED DESCRIPTION OF THE PRESENT INVENTION

Words of orientation, such as "top", bottom", etc, are referenced to the operational position of the device, which is with the grill 128 on the bottom facing downward from the ceiling. The nominal size of the illustrated embodiment is 6"×24" grill width by length. However, the actual size is 5.75"×23.75", as it is standard in the industry for the actual dimensions to be one-quarter-inch shorter than the nominal dimensions to allow some leeway when installing in a suspended ceiling T-bar frame.

Figure 1:
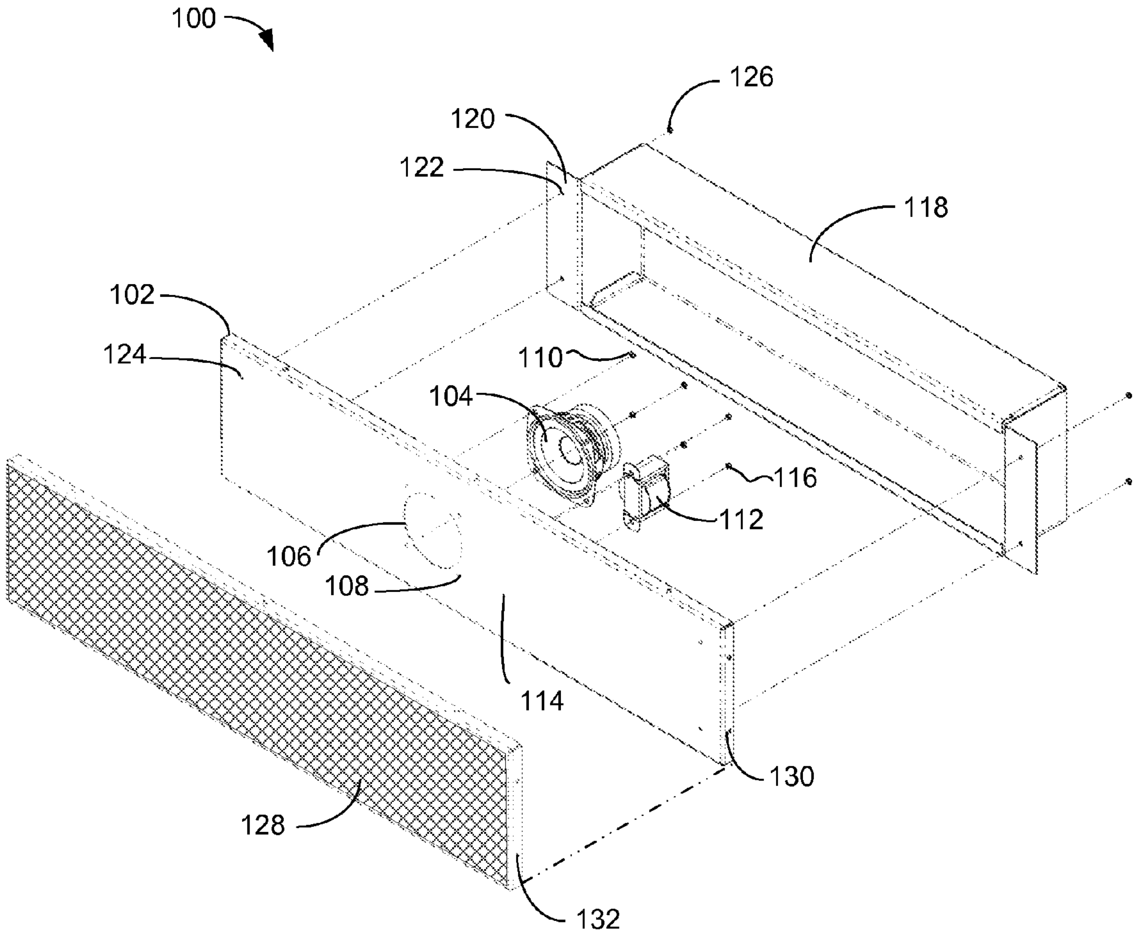
FIG. 1 is a front top perspective exploded view illustrating a first exemplary embodiment of the narrow ceiling speaker panel system, according to a preferred embodiment of the present invention.

FIG. 1 is a front top perspective exploded view illustrating a first exemplary embodiment of the narrow ceiling speaker panel system 100, according to a preferred embodiment of the present invention. Baffle 102 has an opening 106 to which audio speaker 104 is aligned so that the sound output of speaker 104 can be heard. Speaker 104 is fastened to the top side of baffle 102 by fasteners 110 (one of four labeled) through speaker flanges, as shown, and into pre-drilled or punched holes 108 (one of four labeled) in baffle 102. Associated electronics 112, illustrated as a transformer 112, is fastened to the top side of baffle 102 by fasteners 116 (one of two labeled) through transformer flanges, as shown, and into pre-drilled holes 114 (one of two labeled) in baffle 102. Grill box 118 has first and second end flanges 120 (one of two labeled) and is fastened to the top side of baffle 102 using four fasteners 126 (one of three visible labeled), through four pre-drilled holes 122 (one of four labeled, two on each end flange 120) and into baffle screw holes 124 (one of four labeled) in baffle 102. Baffle 102 has a flanged perimeter baffle edge 602 (see FIG. 6) and grill box 118 nests within, or is enveloped by, the baffle edge 602 of baffle 102. Grill 128 is a multi-perforate panel with flanged perimeter grill edge 1110 (see FIG. 11). Baffle 120, with all attachments 104, 112, and 118 nests within, or is enveloped by, grill edge 1110. Grill 128 is fastened to baffle 102 using fasteners (not shown) through ten grill edge holes 132 (one of five visible labeled) and into ten corresponding baffle edge holes 130 (one of five visible labeled). As the grill 128 has the widest and longest dimensions in order to accommodate the nesting of the baffle 102, the dimensions of this embodiment of the narrow ceiling speaker panel system 100 are defined by the grill 128.

Grill 128 will be the only part of the narrow ceiling speaker panel system 100 visible to the user once installed. In additional embodiments, grill 128 may be finished in various ways, such as white metal, metallic, or given a wooden appearance. Likewise, in some embodiments, only the portion of the grill 128 aligned to the speaker opening 106 may be multi-perforate. In still other embodiments, perforations aligned to the speaker opening 106 may be part of an artistic design of perforations. The grill 128 preferably has a decorative appearance by virtue of edge style, pattern of holes, color, or finish.

The illustrated embodiment is of a nominally 6"×24" ceiling speaker panel. Other nominal sizes within the narrow ceiling speaker panel system 100 include, without limitation: 6"×6", 6"×12", 6"×42", 6"×48", 6"×54", 6"×60", 6"×96", 4"×48", and 4"×60". The edge treatment shown for grill 128 is a beveled lay-in, as a curve is created when the metal material of the grill 128 is folded to form the grill edge 1110. In additional embodiments, additional edge styles may be used and are within the scope of the present invention. For example, and without limitation, square lay-in, square tegular, beveled tegular, and square tegular with a reveal may be used as edge styles.

Figure 2:
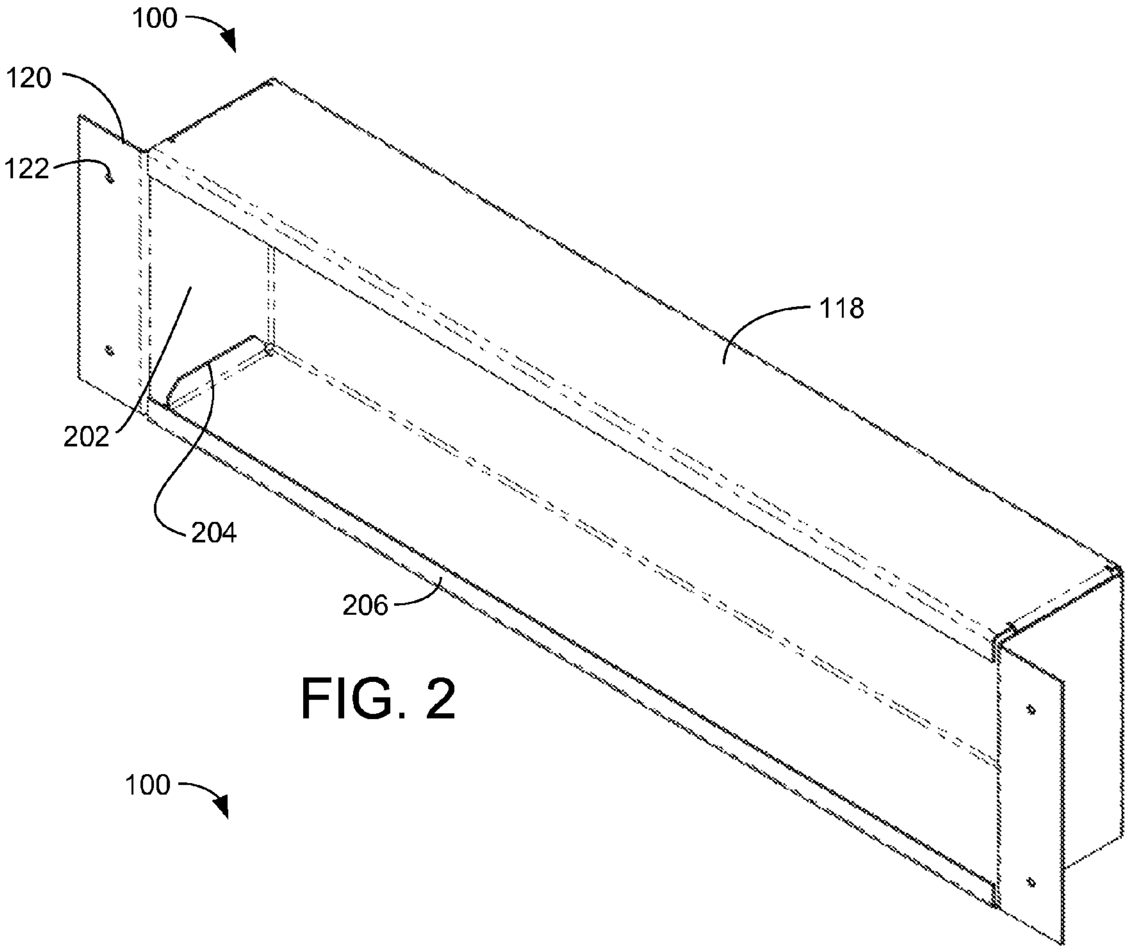
FIG. 2 is a bottom-side perspective view illustrating an exemplary embodiment of a grill box of the narrow ceiling speaker panel system of FIG. 1, according to a preferred embodiment of the present invention.

FIG. 2 is a bottom-side perspective view illustrating an exemplary embodiment of a grill box 118 of the narrow ceiling speaker panel system 100 of FIG. 1, according to a preferred embodiment of the present invention Inner folded long edges 206 (one on two labeled) rest against the top surface of baffle 102 when the exemplary embodiment of the narrow ceiling speaker panel system 100 is assembled. End panel 202 (one of two labeled) is folded to form end flange 120, as shown. Side panel inner flange 204 provides support for end panel 202. The entire grill box 118 is preferably folded from a single cut sheet of metal.

Figure 3:
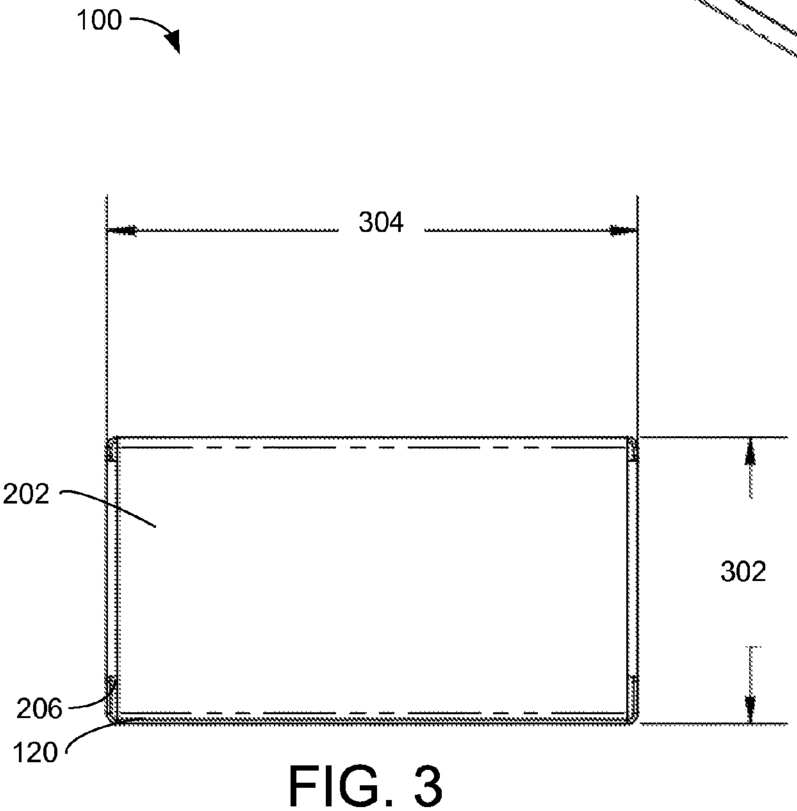
FIG. 3 is an end elevation view illustrating the exemplary embodiment of the grill box of FIG. 2 of the narrow ceiling speaker panel system of FIG. 1, according to a preferred embodiment of the present invention.

FIG. 3 is an end elevation view illustrating the exemplary embodiment of the grill box 118 of FIG. 2 of the narrow ceiling speaker panel system 100 of FIG. 1, according to a preferred embodiment of the present invention. The height 302 of the exemplary grill box 118 is preferably 5.534 inches. The width 304 of the exemplary grill box 118 is preferably three inches.

Figure 4:
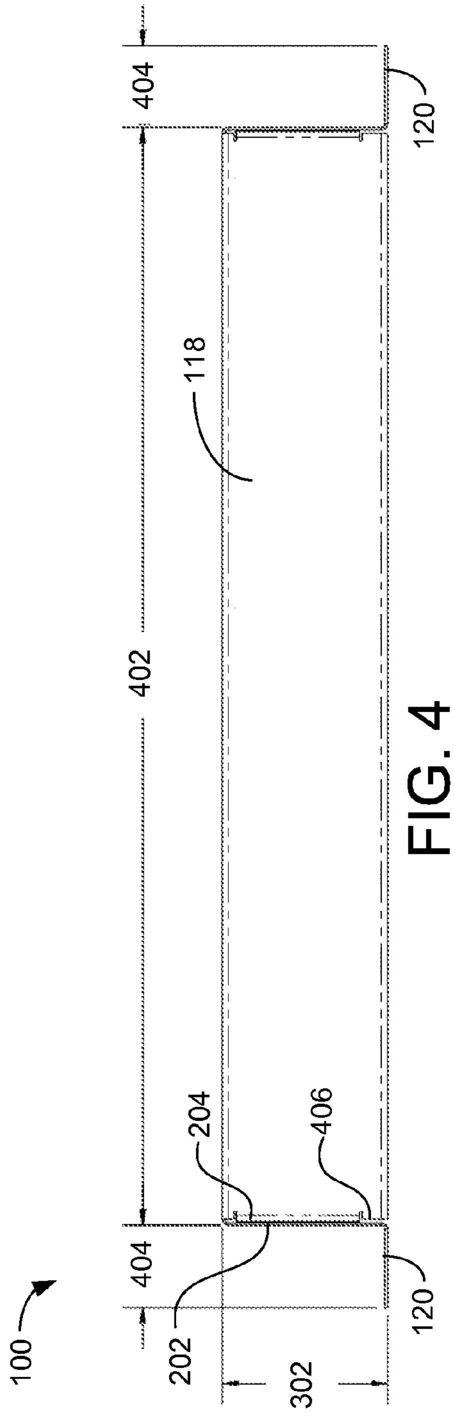
FIG. 4 is a side elevation view illustrating the exemplary embodiment of the grill box of FIG. 2 of the narrow ceiling speaker panel system of FIG. 1, according to a preferred embodiment of the present invention.

FIG. 4 is a side elevation view illustrating the exemplary embodiment of the grill box 118 of FIG. 2 of the narrow ceiling speaker panel system 100 of FIG. 1, according to a preferred embodiment of the present invention. The length 402 of grill box 118 between the outside surfaces of end panels 202 is preferably twenty inches. The inside length extension 404 of grill box flange 120 is preferably one-and-one-half inches, for a total grill box 118 length 526 (see FIG. 5) of twenty-three inches. Flange 204 leaves a slight gap between the end edge 406 of the side panel of grill box 118 and the end panel 202.

Figure 5:
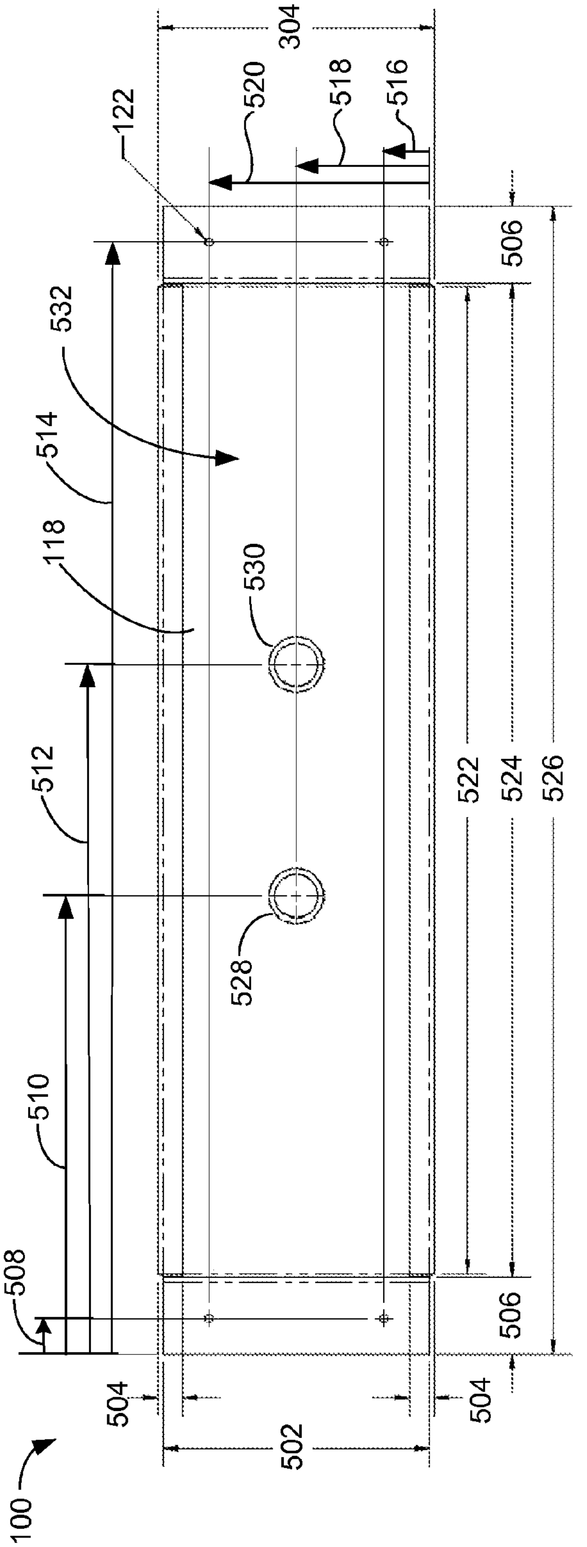
FIG. 5 is a top plan view illustrating the exemplary embodiment of the grill box of FIG. 2 of the narrow ceiling speaker panel system of FIG. 1, according to a preferred embodiment of the present invention.

FIG. 5 is a top plan view illustrating the exemplary embodiment of the grill box 118 of FIG. 2 of the narrow ceiling speaker panel system 100 of FIG. 1, according to a preferred embodiment of the present invention. Top panel 532 of grill box 118 has first and second grill box cable holes 528 and 539, respectively, for routing power and signal lines to the speaker 104 and the associated electronics 112. First and second grill box cable holes 528 and 539 each have a diameter of 0.564 inches in the exemplary embodiment. In some embodiments, first and second grill box cable holes 528 and 539 may be knock outs. In some embodiments, first and second grill box cable holes 528 and 539 may be fitted with grommets.

The width 502 of end flange 120 is preferably 5.312 inches in the exemplary embodiment. The edge curvature width 504 is preferably one-half inch in the exemplary embodiment. The total flange length 506 is preferably 1.545 inches in the exemplary embodiment. The grill box first flange screw hole margin 509 is preferably 0.717 inches in the exemplary embodiment. The grill box first cable hole transverse centerline margin 510 is preferably 9.176 inches in the exemplary embodiment. The grill box second cable hole transverse centerline margin 512 is preferably 13.820 inches in the exemplary embodiment. The grill box second flange screw hole margin 514 is preferably 22.283 inches in the exemplary embodiment. Flange screw hole 122 preferably has a diameter of 0.156 inches in the exemplary embodiment. The grill box flange first screw hole side offset 516 is preferably 0.906 inches in the exemplary embodiment. The grill box cable openings centerline offset 518 is preferably 2.656 inches in the exemplary embodiment. The grill box flange second screw hole side offset 520 is preferably 4.406 inches in the exemplary embodiment. The edge 406 to edge 406 grill box length 522 is preferably 19.778 inches in the exemplary embodiment. The inner flange 204 to inner flange 204 grill box length 524 is preferably 19.910 inches in the exemplary embodiment. The total grill box and flange length 526 is preferably twenty-three inches in the exemplary embodiment.

Figure 6:
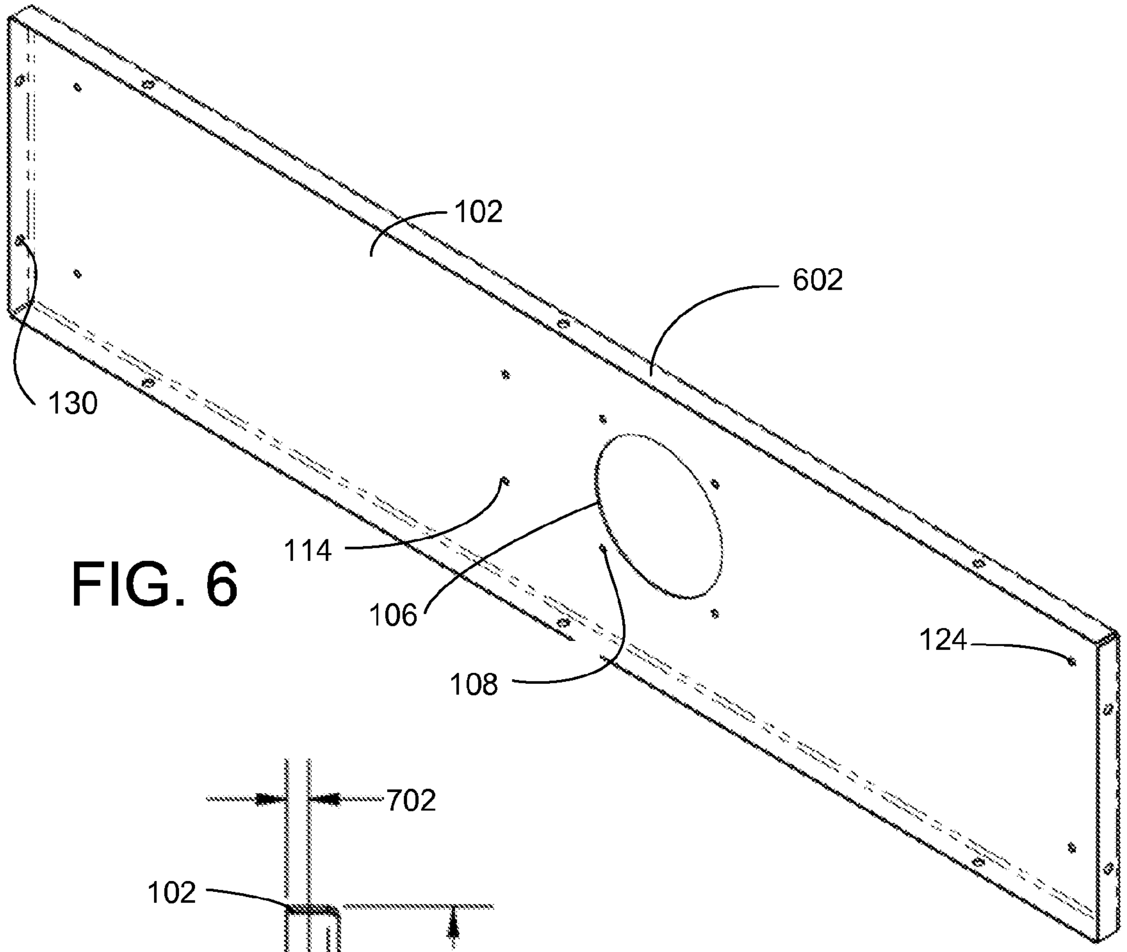
FIG. 6 is a perspective view illustrating an exemplary embodiment of a baffle of the narrow ceiling speaker panel system of FIG. 1, according to a preferred embodiment of the present invention.

FIG. 6 is a perspective view illustrating an exemplary embodiment of a baffle 102 of the narrow ceiling speaker panel system 100 of FIG. 1, according to a preferred embodiment of the present invention. The top side of baffle 102 is illustrated in FIG. 6, as compared to the bottom side illustrated in FIG. 1. Baffle 102 has flanged edges 602 about its perimeter. The four flanged edges 602 (one of four labeled) have predrilled holes 130 (one of ten labeled) distributed as two in each end flange 602 and three in each side flange 602. Baffle 102 is preferably made of one piece of sheet metal.

Figure 7:
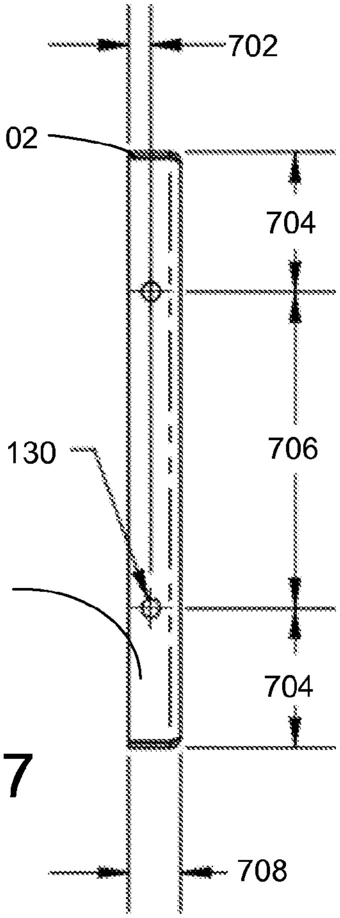
FIG. 7 is an end elevation view illustrating the exemplary embodiment of the baffle of FIG. 6 of the narrow ceiling speaker panel system of FIG. 1, according to a preferred embodiment of the present invention.

FIG. 7 is an end elevation view illustrating the exemplary embodiment of the baffle 102 of FIG. 6 of the narrow ceiling speaker panel system 100 of FIG. 1, according to a preferred embodiment of the present invention. The baffle edge screw hole side margin 702 is preferably 0.211 inches in the exemplary embodiment. The baffle end edge screw hole end margin 704 is preferably 1.326 inches in the exemplary embodiment. The baffle end edge screw hole spacing 706 is preferably three inches in the exemplary embodiment. The baffle edge depth 708 is preferably 0.494 inches in the exemplary embodiment.

Figure 8:
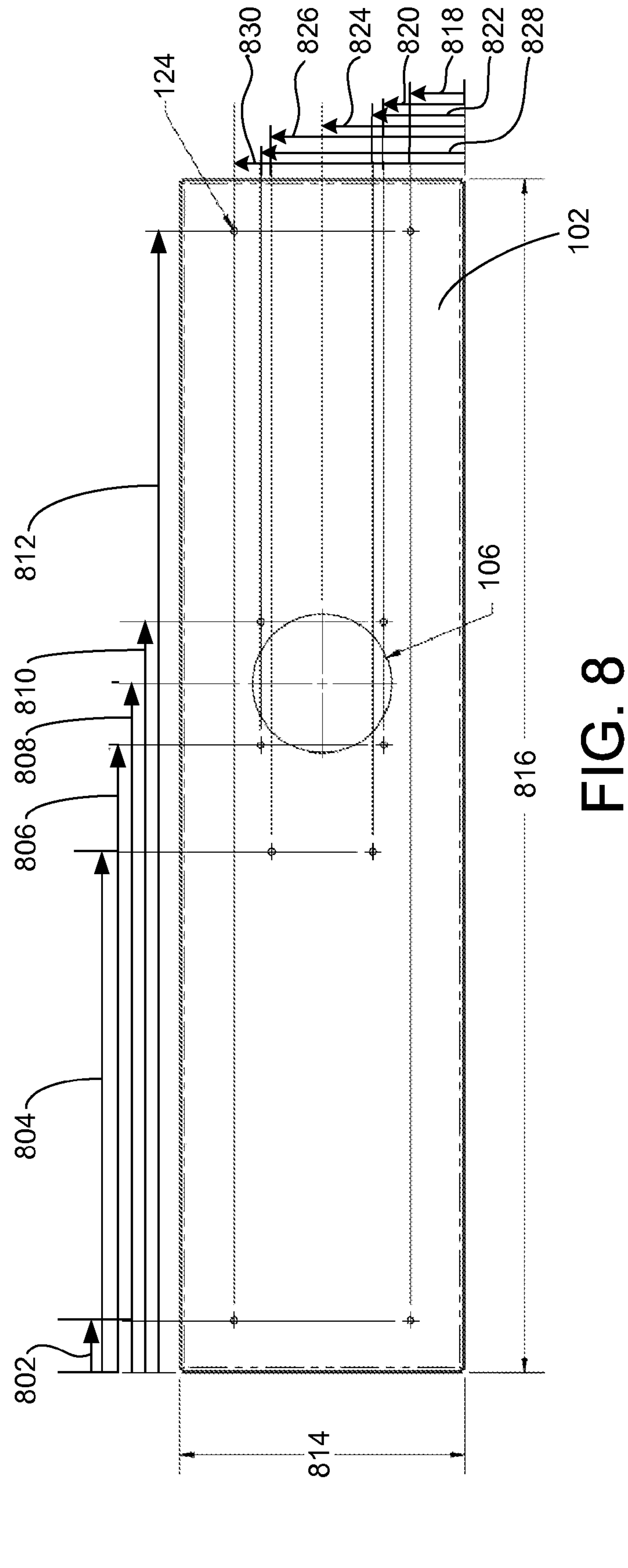
FIG. 8 is a bottom plan view illustrating the exemplary embodiment of the baffle of FIG. 6 of the narrow ceiling speaker panel system of FIG. 1, according to a preferred embodiment of the present invention.

FIG. 8 is a bottom plan view illustrating the exemplary embodiment of the baffle 102 of FIG. 6 of the narrow ceiling speaker panel system 100 of FIG. 1, according to a preferred embodiment of the present invention. Preferably, speaker opening 106 has a diameter of 2.750 inches in the exemplary embodiment. The first baffle-to-grill screw hole 124 end margin 802 is preferably 1.043 inches in the exemplary embodiment. The transformer screw holes end margin 804 is preferably 10.325 inches in the exemplary embodiment. The first speaker holes end margin 806 is preferably 12.433 inches in the exemplary embodiment. The speaker opening transverse centerline margin 808 is preferably 13.625 inches in the exemplary embodiment. The second speaker holes end margin 810 is preferably 14.870 inches in the exemplary embodiment. The second baffle to grill screw hole end margin 812 is preferably 22.609 inches in the exemplary embodiment.

The baffle width 814 is preferably 5.652 inches in the exemplary embodiment. The baffle length 816 is preferably 23.652 inches in the exemplary embodiment. The first baffle-to-grill screw hole side margin 818 is preferably 1.076 inches in the exemplary embodiment. The first speaker support holes side margin 820 is preferably 1.608 inches in the exemplary embodiment. The first transformer screw hole side margin 822 is preferably 1.826 inches in the exemplary embodiment. The speaker opening longitudinal centerline margin 824 is preferably 2.826 inches in the exemplary embodiment. The second transformer support screw hole side margin 826 is preferably 3.826 inches in the exemplary embodiment. The second speaker support holes side margin 828 is preferably 4.044 inches in the exemplary embodiment. The second baffle-to-grill screw hole side margin 830 is preferably 4.576 inches in the exemplary embodiment.

Figure 9:
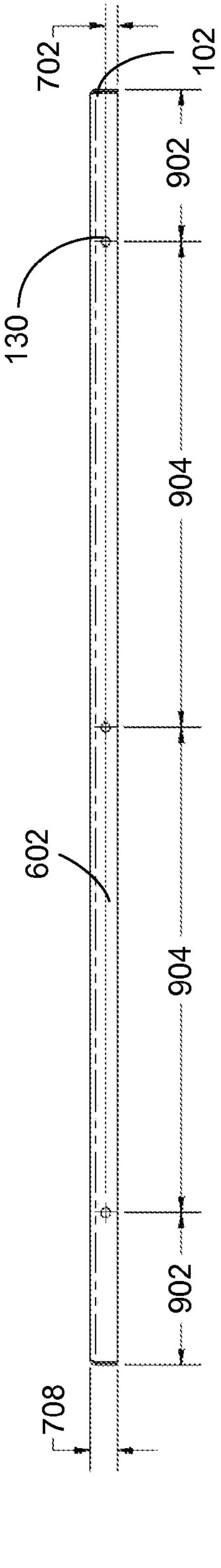
FIG. 9 is a side elevation view illustrating the exemplary embodiment of the baffle of FIG. 6 of the narrow ceiling speaker panel system of FIG. 1, according to a preferred embodiment of the present invention.

FIG. 9 is a side elevation view illustrating the exemplary embodiment of the baffle 102 of FIG. 6 of the narrow ceiling speaker panel system 100 of FIG. 1, according to a preferred embodiment of the present invention. The baffle side edge screw hole end margin 902 is preferably 2.826 inches in the exemplary embodiment. The baffle side edge screw hole spacing 904 is preferably nine inches in the exemplary embodiment.

Figure 10:
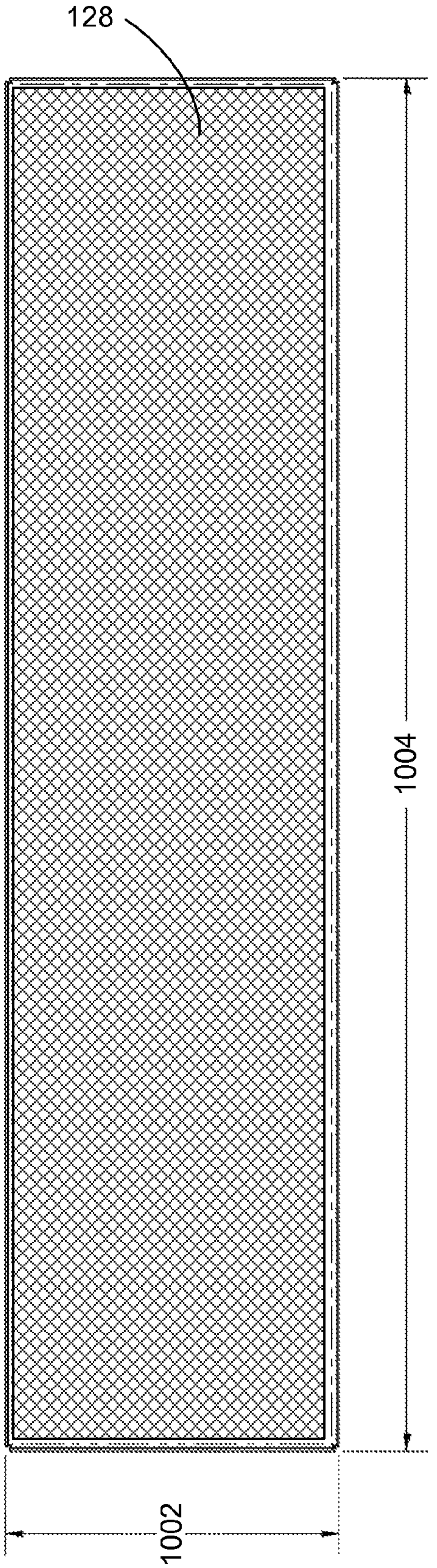
FIG. 10 is a bottom plan view illustrating an exemplary embodiment of a grill of the narrow ceiling speaker panel system of FIG. 1, according to a preferred embodiment of the present invention.

FIG. 10 is a bottom plan view illustrating an exemplary embodiment of a grill 128 of the narrow ceiling speaker panel system 100 of FIG. 1, according to a preferred embodiment of the present invention. The grill width 1002 is preferably 5.750 inches in the exemplary embodiment. The grill length is preferably 23.750 inches in the exemplary embodiment.

Figure 11:
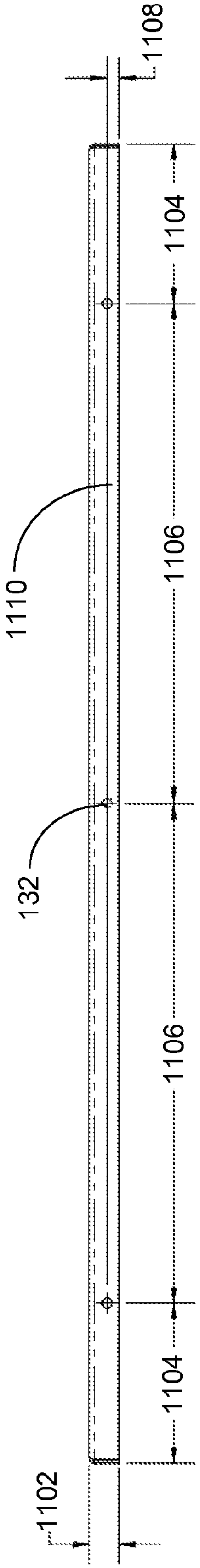
FIG. 11 is a side elevation view illustrating the exemplary embodiment of a grill of FIG. 10 of the narrow ceiling speaker panel system of FIG. 1, according to a preferred embodiment of the present invention.

FIG. 11 is a side elevation view illustrating the exemplary embodiment of a grill 128 of FIG. 10 of the narrow ceiling speaker panel system 100 of FIG. 1, according to a preferred embodiment of the present invention. Grill side 1110 is a bent-over flange of grill 128. Grill 128 is preferably made of a single piece of sheet metal. The grill thickness 1102 is preferably 0.539 inches in the exemplary embodiment. The grill side screw hole end margin 1104 is preferably 2.875 inches in the exemplary embodiment. The grill side screw hole spacing 1106 is preferably nine inches in the exemplary embodiment. The grill side screw hole side margin 1108 is preferably 0.217 inches in the exemplary embodiment.

Figure 12:
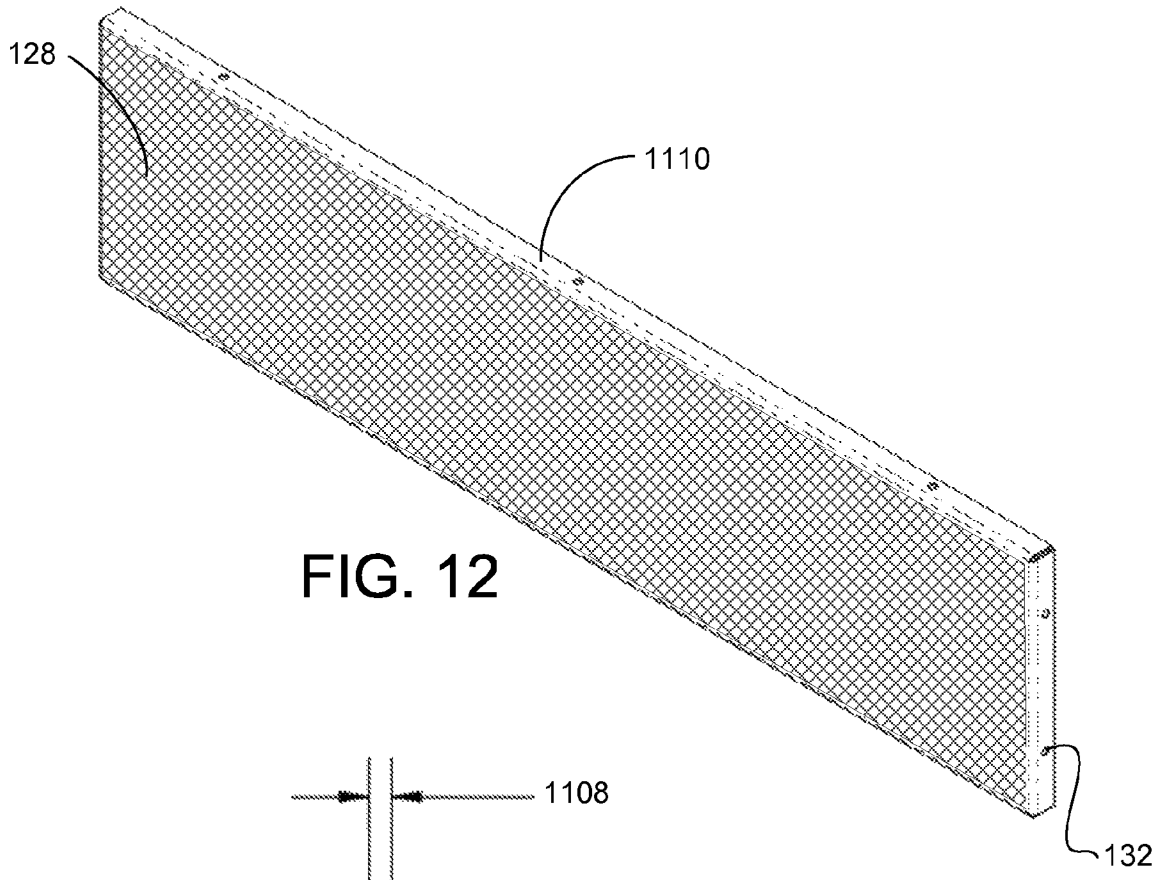
FIG. 12 is a bottom-end perspective view illustrating the exemplary embodiment of a grill of FIG. 10 of the narrow ceiling speaker panel system of FIG. 1, according to a preferred embodiment of the present invention.

FIG. 12 is a bottom-end perspective view illustrating the exemplary embodiment of a grill 128 of FIG. 10 of the narrow ceiling speaker panel system 100 of FIG. 1, according to a preferred embodiment of the present invention. Grill 128 is the only part of the invention visible to users once installed in a ceiling.

Figure 13:
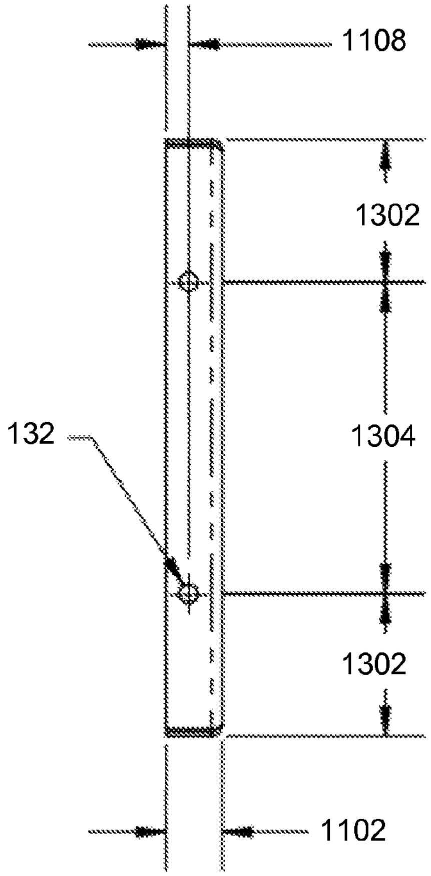
FIG. 13 is an end elevation view illustrating the exemplary embodiment of a grill of FIG. 10 of the narrow ceiling speaker panel system of FIG. 1, according to a preferred embodiment of the present invention.

FIG. 13 is an end elevation view illustrating the exemplary embodiment of a grill 128 of FIG. 10 of the narrow ceiling speaker panel system 100 of FIG. 1, according to a preferred embodiment of the present invention. The grill end screw hole end margin 1302 is preferably 1.375 inches in the exemplary embodiment. The grill end screw hole spacing is preferably three inches in the exemplary embodiment.

Figure 14:
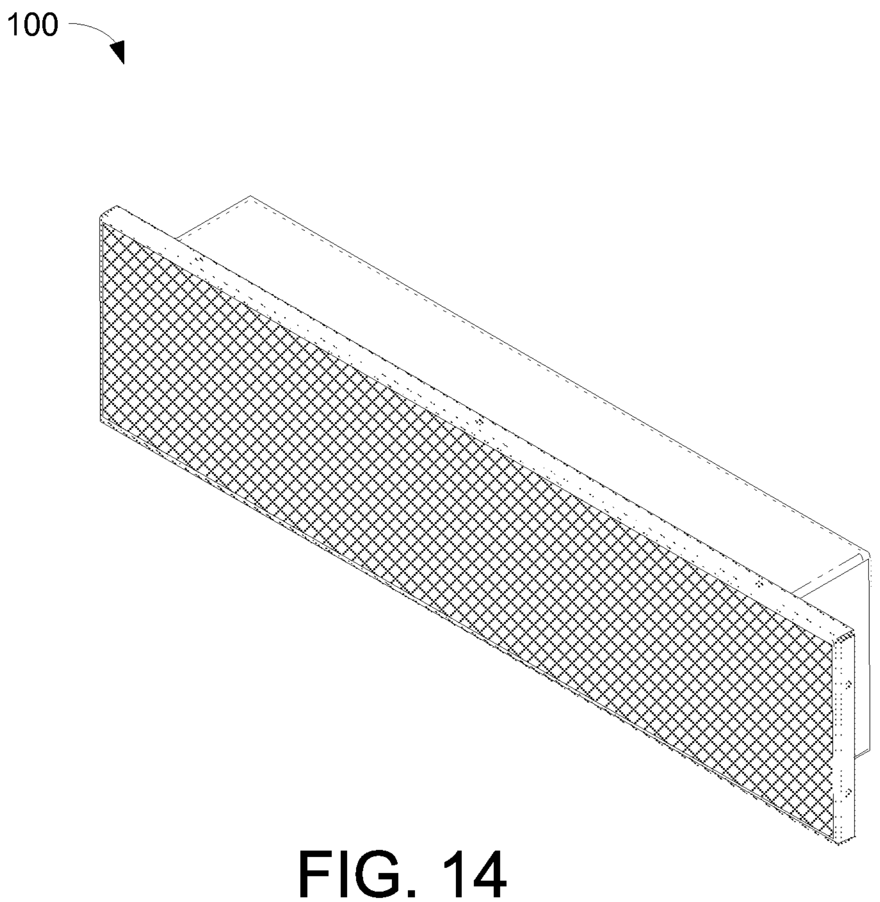
FIG. 14 is a bottom-side perspective view illustrating the assembled exemplary embodiment of the narrow ceiling speaker panel system of FIG. 1, according to a preferred embodiment of the present invention.

FIG. 14 is a bottom-side perspective view illustrating the assembled exemplary embodiment of the narrow ceiling speaker panel system 100 of FIG. 1, according to a preferred embodiment of the present invention.

Although applicant has described applicant's exemplary embodiment of this invention, it will be understood that the broadest scope of this invention includes the various additional embodiments also mentioned as well as such modifications as diverse finishes and materials. Such scope is limited only by the above specification ad the claims below.

Further, many other advantages of applicant's invention will be apparent to those skilled in the art from the above descriptions.

The invention claimed is:

1. A ceiling panel loudspeaker comprising:

a. a grill box having first and second end flanges extending from first and second bottom edges of respective first and second sides;

b. a baffle having a perimeter flange sized to envelop a bottom portion of said grill box and having at least one speaker opening for aligning to an output portion of a loudspeaker; and c. a foraminous speaker grill:

i. having a grill perimeter flange sized to envelop said baffle; and ii. sized to fit within a narrow slot between suspended ceiling supports.

2. The ceiling panel loudspeaker of claim 1, further comprising at least one said loudspeaker attached to a top side of said baffle and aligned to said at least one speaker opening.

3. The ceiling panel loudspeaker of claim 1, further comprising electronics associated with said loudspeaker attached to said top side of said baffle and coupled to said at least one loudspeaker.

4. The ceiling panel loudspeaker of claim 1, wherein said baffle is attached to said grill box using fasteners through said first and second end flanges.

5. The ceiling panel loudspeaker of claim 1, wherein said grill is attached to said baffle using fasteners through said grill perimeter flange and through said baffle perimeter flange.

6. The ceiling panel loudspeaker of claim 1, wherein said grill box further comprises at least two openings for conducting power and signal cables to said electronics and said at least one loudspeaker.

7. The ceiling panel loudspeaker of claim 1, wherein said grill box is formed from a single cut sheet of metal.

8. The ceiling panel loudspeaker of claim 1, wherein said grill has a width for fitting said narrow slot and said width of said narrow slot comprises one of six inches and four inches.

9. The ceiling panel loudspeaker of claim 1, wherein said grill has a length comprising one of six inches, twelve inches, forty-two inches, forty-eight inches, fifty-four inches, sixty inches, and ninety-six inches.

10. The ceiling panel loudspeaker of claim 1, wherein said grill has a decorative appearance.

11. A ceiling panel loudspeaker comprising:

a. a grill box having:

i. first and second end flanges extending from first and second bottom edges of respective first and second sides; and ii. first and second cable openings;

b. a baffle comprising a panel having:

i. a perimeter flange sized to envelop a bottom portion of said grill box;

ii. at least one loudspeaker opening for aligning to an output portion of a loudspeaker; and iii. a plurality of fastener openings proximate each said at least one loudspeaker opening; and c. a foraminous speaker grill:

i. having a grill perimeter flange sized to envelop said baffle; and ii. sized to fit within a narrow slot between suspended ceiling supports.

12. The ceiling panel loudspeaker of claim 11, further comprising:

a. at least one said loudspeaker attached to a top side of said baffle and aligned to said at least one loudspeaker opening, respectively;

b. electronics associated with said at least one loudspeaker attached to said top side of said baffle and coupled to said at least one loudspeaker.

13. The ceiling panel loudspeaker of claim 11, wherein:

a. said baffle is attached to said grill box using fasteners through said first and second end flanges; and b. said grill is attached to said baffle using fasteners through said grill perimeter flange and through said baffle perimeter flange.

14. The ceiling panel loudspeaker of claim 11, wherein said grill box is formed from a single cut sheet of metal.

15. The ceiling panel loudspeaker of claim 11, wherein said grill has:

a. a width for fitting said narrow slot and said width of said narrow slot comprises one of six inches and four inches; and b. a length comprising one of six inches, twelve inches, forty-two inches, forty-eight inches, fifty-four inches, sixty inches, and ninety-six inches.

16. The ceiling panel loudspeaker of claim 11, wherein said grill has a decorative appearance.

17. A ceiling panel loudspeaker comprising:

a. a grill box made of a single piece of cut sheet metal having:

i. first and second end flanges extending from first and second bottom edges of respective first and second sides; and ii. first and second cable openings;

b. a baffle comprising a panel having:

i. a perimeter flange sized to envelop a bottom portion of said grill box;

ii. at least one loudspeaker opening for aligning to an output portion of a loudspeaker; and iii. a plurality of fastener openings proximate each said at least one loudspeaker opening; and c. a foraminous speaker grill:

i. having a grill perimeter flange sized to envelop said baffle; and ii. sized to fit within a narrow slot between suspended ceiling supports; and d. a plurality of fasteners for fastening said baffle to said grill box and for fastening said grill to said baffle.

18. The ceiling panel loudspeaker of claim 17, further comprising:

a. at least one said loudspeaker attached to a top side of said baffle and aligned to said at least one loudspeaker opening, respectively;

b. electronics associated with said at least one loudspeaker attached to said top side of said baffle and coupled to said at least one loudspeaker.

19. The ceiling panel loudspeaker of claim 17, wherein:

a. said baffle is attached to said grill box using fasteners through said first and second end flanges; and b. said grill is attached to said baffle using fasteners through said grill perimeter flange and through said baffle perimeter flange.

20. The ceiling panel loudspeaker of claim 17, wherein said grill has:

a. a width for fitting said narrow slot and said width of said narrow slot comprises one of six inches and four inches; and b. a length comprising one of six inches, twelve inches, forty-two inches, forty-eight inches, fifty-four inches, sixty inches, and ninety-six inches.

* * * * *